(12) United States Patent
Yamamoto et al.

(10) Patent No.: US 7,616,475 B2
(45) Date of Patent: Nov. 10, 2009

(54) MEMORY ELEMENT AND MEMORY

(75) Inventors: Tetsuya Yamamoto, Kanagawa (JP);
Hiroyuki Ohmori, Kanagawa (JP);
Masanori Hosomi, Kanagawa (JP);
Yutaka Higo, Miyagi (JP); Kazutaka Yamane, Miyagi (JP); Yuki Oishi, Kanagawa (JP); Hiroshi Kano, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 11/745,937

(22) Filed: May 8, 2007

(65) Prior Publication Data

US 2007/0263429 A1 Nov. 15, 2007

(30) Foreign Application Priority Data

May 12, 2006 (JP) ............................ P2006-134435

(51) Int. Cl.
*G11C 11/00* (2006.01)
*G11C 11/14* (2006.01)
*G11C 11/15* (2006.01)

(52) U.S. Cl. .................. 365/157; 365/66; 365/158; 365/171; 365/172; 365/173

(58) Field of Classification Search ................. 365/158, 365/171, 157, 172, 173, 66
See application file for complete search history.

(56) References Cited

U.S. PATENT DOCUMENTS

| 4,986,137 A * | 1/1991 | Sato et al. ............... 73/862.336 |
| 6,256,222 B1 * | 7/2001 | Sakakima et al. ........... 365/158 |
| 6,256,223 B1 | 7/2001 | Sun |
| 6,287,703 B1 * | 9/2001 | Inokuti ........................ 428/472 |
| 6,339,543 B1 * | 1/2002 | Shimada et al. ............. 365/157 |
| 6,507,464 B1 * | 1/2003 | Ohashi et al. ............... 360/317 |
| 6,603,677 B2 * | 8/2003 | Redon et al. ................. 365/158 |
| 6,831,312 B2 * | 12/2004 | Slaughter et al. ............ 257/295 |
| 7,282,755 B2 * | 10/2007 | Pakala et al. ................. 257/295 |
| 7,355,885 B2 * | 4/2008 | Fukuzumi .................... 365/158 |
| 7,394,626 B2 * | 7/2008 | Fukumoto et al. ......... 360/324.2 |
| 7,442,263 B2 * | 10/2008 | Gunther et al. ............. 148/307 |
| 2003/0104240 A1 * | 6/2003 | Nakano et al. .............. 428/611 |
| 2005/0036361 A1 * | 2/2005 | Fukuzumi .................... 365/158 |
| 2006/0203540 A1 * | 9/2006 | Fukuzumi .................... 365/158 |
| 2006/0209590 A1 * | 9/2006 | Guo et al. .................... 365/158 |

FOREIGN PATENT DOCUMENTS

| JP | 2002-305337 | 10/2002 |
| JP | 2003-017782 | 1/2003 |
| JP | 2004-006774 | 1/2004 |
| JP | 2005-050907 | 2/2005 |
| JP | 2005-064050 | 3/2005 |

(Continued)

OTHER PUBLICATIONS

Berger, L., "Emission of spin waves by a magnetic multilayer traversed by a current," Physical Review B, vol. 54, pp. 9353-9358, 1996.

(Continued)

*Primary Examiner*—Ly D Pham
(74) *Attorney, Agent, or Firm*—K&L Gates LLP

(57) ABSTRACT

A memory element including a memory layer that retains information based on a magnetization state of a magnetic material is provided. In the memory element, a magnetization pinned layer is provided for the memory layer through an intermediate layer, the intermediate layer is formed of an insulator, spin-polarized electrons are injected in a stacking direction to change a magnetization direction of the memory layer, so that information is recorded in the memory layer. Also, a ferromagnetic layer forming the memory layer has a magnetostriction constant of $1 \times 10^{-5}$ or more.

6 Claims, 3 Drawing Sheets

FOREIGN PATENT DOCUMENTS

WO    WO 2005/050653    6/2005

OTHER PUBLICATIONS

Slonczewski, J.C., "Current-driven excitation of magnetic multilayers," Journal of Magnetism and Magnetic Materials, vol. 159, pp. L1-L7, 1996.

Nikkei Electronics, Feb. 12, 2001, pp. 164-171.

Albert, et al., "Spin-polarized current switching of a Co thin film nanomagnet," Applied Physics Letters, vol. 77, pp. 3809-3811, 2000.

* cited by examiner

PRIOR ART

US 7,616,475 B2

MEMORY ELEMENT AND MEMORY

CROSS REFERENCES TO RELATED APPLICATIONS

The present application claims priority to Japanese Patent Application JP 2006-134435 filed in the Japanese Patent Office on May 12, 2006, the entire contents of which is being incorporated herein by reference.

BACKGROUND

The present disclosure relates to a memory element formed of a memory layer that can store a magnetization state of a ferromagnetic layer as information and a magnetization pinned layer having a pinned magnetization direction, in which current is caused to flow in a direction perpendicular to a film surface to inject spin-polarized electrons, so that a magnetization direction of the memory layer is changed. The present disclosure also relates to a memory including the memory element that may suitably be used as a non-volatile memory.

High-speed and high-density DRAMs have been widely used as random access memories in information devices such as computers.

However, since DRAMs are volatile memories in which information is erased when a power supply is switched off, non-volatile memories in which information is not erased have been desired.

According to Nikkei Electronics, Feb. 12, 2001 (pp. 164-171), for example, Magnetic random access memories (MRAMs) that are configured to record information by magnetization of a magnetic material have attracted attention and developed as potential non-volatile memories.

In an MRAM, current is caused to flow into two types of address wirings almost perpendicular to each other (word lines and bit lines), respectively, to invert magnetization of a magnetic layer of a magnetic memory element in an intersection of the address wirings based on a current magnetic field generated from each address wiring, so that information is recorded.

A schematic view (perspective view) of an MRAM is shown in FIG. 1.

In an area isolated by an element isolation layer 102 of a semiconductor substrate 110 such as a silicon substrate, a drain region 108, source regions 107, and gate electrodes 101 which form selective transistors for selecting each memory cell are respectively formed.

Word lines 105 extending in a longitudinal direction in the figure are provided above the gate electrodes 101.

The drain region 108 is formed both on the left and right selective transistors in the figure, and a wiring 109 is connected to the drain region 108.

Magnetic memory elements 103 each having a memory layer in which a magnetization direction is inverted are placed between the word lines 105 and bit lines 106 that are placed above the word lines 105 and extend in a transverse direction in the figure. The magnetic memory elements 103 are formed of magnetic tunnel junction elements (MTJ elements), for example.

Further, the magnetic memory elements 103 are electrically connected to the source regions 107 through a bypass line 111 in a horizontal direction and a contact layer 104 in a vertical direction.

Current is caused to flow into the word lines 105 and the bit lines 106, respectively, to apply a current magnetic field to the magnetic memory elements 103, so that a magnetization direction of the memory layers of the magnetic memory elements 103 can be inverted to record information.

In order to allow a magnetic memory such as MRAM to stably retain recorded information, a magnetic layer (memory layer) to record information preferably has a certain coercive force.

On the other hand, in order to rewrite the recorded information, a certain amount of current is preferably caused to flow into address wirings.

However, in accordance with reduction in size of an element forming an MRAM, address wirings are thin, and thus a sufficient amount of current may not be caused to flow into the wirings.

Under these circumstances, memories configured to use magnetization inversion by spin injection have been attracted attention as those configured to allow magnetization to be inverted using a smaller amount of current as disclosed in Japanese Patent Application Publication No. 2003-17782, U.S. Pat. No. 6,256,223, Non-Patent Document Phys. Rev. B 54.9353 (1996), and Non-Patent Document J. Magn. Mat. 159.L1 (1996), for example.

In magnetization inversion by spin injection, electrons spin-polarized by passing through a magnetic material are injected into another magnetic material to invert magnetization in the other magnetic material.

For example, current is caused to flow into giant magnetoresistance elements (GMR elements) or magnetic tunnel junction elements (MTJ elements) in a direction perpendicular to a film surface of the elements, so that a magnetization direction of at least some of magnetic layers of the elements can be inverted.

Magnetization inversion by spin injection is advantageous in that magnetization can be inverted without increasing an amount of current even if an element is reduced in size.

FIGS. 2 and 3 show schematic views of a memory configured to utilize the above-described magnetization inversion by spin injection. FIG. 2 is a perspective view, and FIG. 3 is a sectional view.

In an area isolated by an element isolation layer 52 of a semiconductor substrate 60 such as a silicon substrate, a drain region 58, source regions 57, and gate electrodes 51 which form selective transistors for selecting each memory cell are respectively formed. Of these, the gate electrodes 51 also function as word lines extending in a longitudinal direction in FIG. 2.

The drain region 58 is formed in common with the left and right selective transistors in FIG. 2, and a wiring 59 is connected to the drain region 58.

Memory elements 53 each having a memory layer in which a magnetization direction is inverted by spin injection are placed between the source regions 57 and bit lines 56 that are placed above the source regions 57 and extend in a transverse direction in FIG. 2.

The memory elements 53 are formed of magnetic tunnel junction elements (MTJ elements), for example. Reference numerals 61 and 62 in the figure denote magnetic layers. One of the two magnetic layers 61 and 62 is a magnetization pinned layer in which a magnetization direction is pinned, and the other is a magnetization free layer in which a magnetization direction is changed, specifically, a memory layer.

The memory elements 53 are connected to the bit lines 56 and the source regions 57 respectively through upper or lower contact layers 54. Thus, a magnetization direction of the memory layer can be inverted by spin injection by causing current to flow into the memory elements 53.

Such a memory configured to utilize magnetization inversion by spin injection has a feature in that the memory can have a device structure more simplified as compared with a common MRAM shown in FIG. 1.

The memory configured to utilize magnetization inversion by spin injection is more advantageous than a common MRAM in which magnetization is inverted by an external magnetic field, because an amount of writing current is not increased even if the elements are further reduced in size.

In an MRAM, writing wirings (word lines and bit lines) are provided separate from memory elements, and information is written (recorded) based on a current magnetic field generated by causing current to flow into the writing wirings. Thus, an amount of current which may be necessary for writing can be sufficiently caused to flow into the writing wirings.

On the other hand, in a memory configured to utilize magnetization inversion by spin injection, spin injection is preferably performed by causing current to flow into a memory element to invert a magnetization direction of a memory layer.

Since information is written (recorded) by directly causing current to flow into the memory element in this manner, the memory element is connected to a selective transistor to form a memory cell in order to select a memory cell into which data is written. In this case, an amount of current caused to flow into the memory element is limited to an amount of current which can be caused to flow into the selective transistor (saturation current of the selective transistor).

Therefore, writing is preferably performed using current in an amount equal to or smaller than the saturation current of the selective transistor, and an amount of current caused to flow into the memory element is preferably reduced by improving spin injection efficiency.

In order to amplify a read signal, a high magnetoresistance change rate may preferably be obtained. To secure a high magnetoresistance change rate, it is effective to provide a memory element having an intermediate layer in contact with both sides of the memory layer that is a tunnel insulating layer (tunnel barrier layer).

When the tunnel insulating layer is used as an intermediate layer in this manner, an amount of current caused to flow into the memory element is limited in order to prevent dielectric breakdown of the tunnel insulating layer. From this viewpoint, an amount of current during spin injection is preferably suppressed.

Typically, a memory is configured to store and retain information written by current. Thus, a memory layer may need stability against thermal fluctuation (thermal stability).

A memory element utilizing magnetization inversion by spin injection has a memory layer having a smaller volume than that of a memory layer of an MRAM of related art. That is, the memory element tends to have decreased thermal stability.

When the memory layer includes no secured thermal stability, an inverted magnetization direction is inverted again by heat, thereby causing a writing error.

Therefore, thermal stability is a highly important property in the memory element utilizing magnetization inversion by spin injection.

Generally, an element that uses less energy for writing has a lower energy barrier, and hence information may easily be erased from the element.

By contrast, an element that uses more energy for writing may form a higher energy barrier, and hence information may be retained with stability.

When compared memory elements utilizing magnetization inversion by spin injection that are configured to have equal spin injection efficiency, thermal stability increases with an increase in an amount of saturation magnetization and a volume of a memory layer, thereby consuming a larger amount of current for writing.

A thermal stability index may generally be represented by a thermal stability parameter ($\Delta$).

The thermal stability parameter ($\Delta$) is obtained from the following equation:

$\Delta = KV/kT$ (K: anisotropic energy, V: volume of the memory layer, k: Boltzmann constant, T: temperature).

Accordingly, in order for a memory that is configured to have a memory layer in which a magnetization direction is inverted by spin injection to be used as a memory element, an amount of current necessary for magnetization inversion may be reduced to equal to or smaller than saturation current of a transistor by increasing spin injection efficiency, and thermal stability may be acquired to stably retain written information.

SUMMARY

According to the present embodiments, there is provided a memory element that can improve thermal stability without increasing an amount of writing current, and a memory including the memory element.

A memory element according to an embodiment includes a memory layer that retains information based on a magnetization state of a magnetic material, where a magnetization pinned layer is provided for the memory layer through an intermediate layer; the intermediate layer is formed of an insulator; spin-polarized electrons are injected in a stacking direction to change a magnetization direction of the memory layer, so that information is recorded in the memory layer; and a ferromagnetic layer forming the memory layer has a magnetostriction constant of $1 \times 10^{-5}$ or more.

A memory according to an embodiment includes a memory element having a memory layer that retains information based on a magnetization state of a magnetic material; and two types of wirings intersecting with each other, where the memory element includes a memory element according to the above embodiment of the present invention; the memory element is placed near an intersection of the two types of wirings and between the two types of wirings; and current in a stacking direction flows into the memory element through the two types of wirings, so that spin-polarized electrons are injected.

A memory element according to the above embodiment includes a memory layer that retains information based on a magnetization state of a magnetic material, where a magnetization pinned layer is provided for the memory layer through an intermediate layer; the intermediate layer is formed of an insulator; and spin-polarized electrons are injected in a stacking direction to change a magnetization direction of the memory layer, so that information is recorded in the memory layer. Thus, spin-polarized electrons can be injected by causing current to flow in a stacking direction to record information.

A ferromagnetic layer forming the memory layer has a magnetostriction constant of $1 \times 10^{-5}$ or more, so that the memory layer can have an increased coercive force. The memory layer can have an increased coercive force in this manner, and thus the memory layer can have improved thermal stability.

Further, a ferromagnetic layer forming the memory layer has a magnetostriction constant of $1 \times 10^{-5}$ or more, so that the memory layer can have an increased coercive force without increasing an amount of saturation magnetization of the memory layer.

Sufficient thermal stability of the memory layer can thus be obtained without increasing an amount of writing current which may be necessary to invert a magnetization direction of the memory layer.

A memory according to the above embodiment includes a memory element having a memory layer that retains information based on a magnetization state of a magnetic material; and two types of wirings intersecting with each other, where the memory element includes a memory element according to the above embodiment of the present invention; the memory element is placed near an intersection of the two types of wirings and between the two types of wirings; and current in a stacking direction flows into the memory element through the two types of wirings, so that spin-polarized electrons are injected. Thus, information can be recorded by spin injection by causing current to flow through the two types of wirings in a stacking direction of the memory element.

Further, sufficient thermal stability of the memory layer can be obtained without increasing an amount of writing current which may be necessary to invert a magnetization direction of the memory layer of the memory element. Thus, information recorded in a memory cell can be stably retained without increasing power consumption in the memory.

According to the above embodiment, thermal stability as an information retaining property can be obtained without increasing an amount of current which may be necessary for inverting a magnetization direction of the memory layer (threshold current). Thus, a memory element having excellent property equilibrium can be formed.

This can eliminate an operation error and provide a sufficient operation allowance for a memory element.

Further, since an amount of writing current is not increased even if thermal stability that is necessary for a memory is obtained, a large amount of current may not have to be applied. Thus, an insulator as an intermediate layer may not be damaged.

Accordingly, a highly reliable memory that is stably operated may be produced.

Further, sufficient thermal stability that may be necessary for a memory can be obtained even if an amount of writing current is reduced, and thus an amount of writing current can be decreased to reduce power consumption when performing writing in the memory element.

Accordingly, total power consumption in a memory may also be reduced.

Additional features and advantages are described herein, and will be apparent from, the following Detailed Description and the figures.

DETAILED DESCRIPTION

Figure 1:
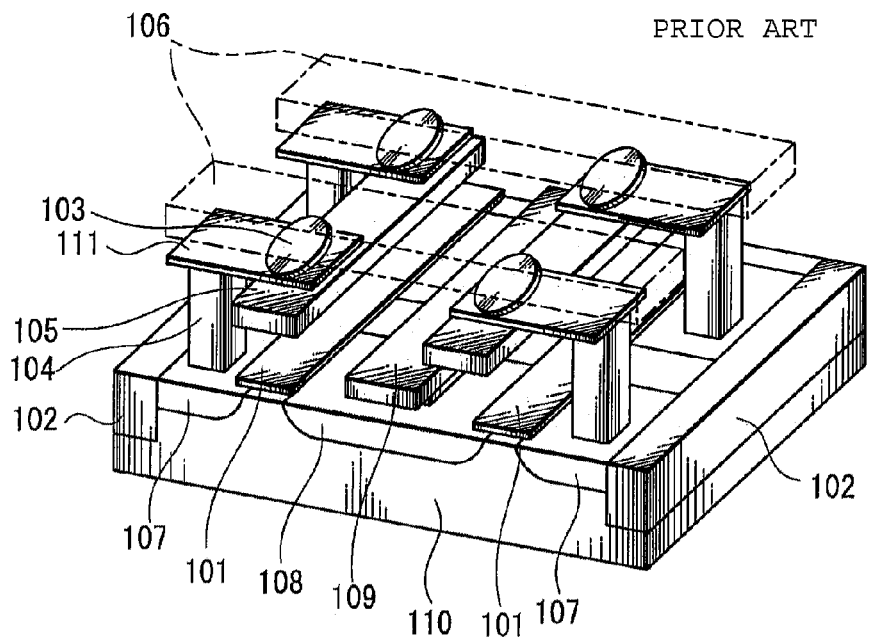
FIG. 1 is a perspective view schematically showing a configuration of an MRAM of a related art.

An outline of the present disclosure is first described before describing the specific embodiments.

In an embodiment, information is recorded by inverting a magnetization direction of a memory layer of a memory element with the above-described spin injection. The memory layer is formed of a magnetic material such as a ferromagnetic layer and retains information based on a magnetization state (magnetization direction) of the magnetic material.

In a basic operation of inverting a magnetization direction of a magnetic layer by spin injection, current having a certain threshold value (Ic) or higher is caused to flow into a memory element formed of a giant magnetoresistance element (GMR element) or magnetic tunnel junction element (MTJ element) in a direction perpendicular to a film surface of the memory element. Here, a polarity (direction) of current depends on a magnetization direction to be inverted.

When current having an absolute value smaller than the threshold value is caused to flow, magnetization inversion does not occur.

A threshold value Ic of current which may be necessary for inverting a magnetization direction of a magnetic layer by spin injection is phenomenologically represented by the following equation 1 (see F. J. Albert et al., Appl. Phys. Lett., 77, p. 3809, 2000, for example).

$$Ic = A \frac{\alpha}{\eta} Ms^2 V \qquad 1$$

In the equation 1, A is a constant, $\alpha$ is a spin damping constant, $\eta$ is spin injection efficiency, Ms is an amount of saturation magnetization, and V is a volume of a magnetic layer (memory layer).

According to an embodiment, a threshold value of current can be optionally selected by controlling a volume of a magnetic layer V, an amount of saturation magnetization of a magnetic layer Ms, spin injection efficiency, and a damping constant, as represented by the equation 1.

A memory element is formed having a magnetic layer (memory layer) that can retain information based on a magnetization state and a magnetization pinned layer in which a magnetization direction is pinned.

A typical memory may be configured to retain written information. Information retaining ability is evaluated as a value of the above-described thermal stability index $\Delta$. A thermal stability index $\Delta$ of a magnetic layer (memory layer) is represented by the following equation 2.

$$\Delta = B \cdot Hc_o \cdot Ms \cdot V \qquad 2$$

In the equation 2, B is a constant, $Hc_0$ is a coercive force at 0 K Hc, Ms is an amount of saturation magnetization, and V is a volume.

Generally, a thermal stability index $\Delta$ is preferably 60 or more in order to retain stored information at 85° C. for 10 years. The thermal stability index $\Delta$ and a threshold value of current Ic often have a trade-off relation, and may often require both values simultaneously to maintain memory characteristics.

In a substantially elliptical tunnel magnetoresistance element (TMR element) having a memory layer with a thickness of 2 mm and having a flat pattern of 100 nm×100 nm, for example, current to change a magnetization state of the memory layer actually has threshold values in which a positive threshold value +Ic=+0.5 mA and a negative threshold value −Ic=−0.3 mA. A current density at this point is about $3.5 \times 10^6$ A/cm². These threshold values almost correspond to those calculated from the equation 1.

In contrast, in a typical MRAM in which magnetization is inverted based on a current magnetic field, an amount of writing current is preferably several mA or more.

A memory in which magnetization inversion is performed by spin injection may effectively reduce power consumption in an integrated circuit, because a threshold value of writing current can be sufficiently small as described above.

Further, the memory is more advantageous than a typical MRAM in terms of integration density, because the memory does not have to use a wiring for generating a current magnetic field (wiring 105 in FIG. 1) which may be necessary for a common MRAM.

Since information is written (recorded) by directly causing current to flow into a memory element in a memory in which magnetization inversion is performed by spin injection, the memory element is connected to a selective transistor to form a memory cell in order to select a memory cell into which data is written.

In this case, an amount of current caused to flow into the memory element is limited to an amount of current which can be caused to flow into the selective transistor (saturation current of the selective transistor). Thus, an allowable range in current for writing is also limited.

By contrast, when a magnetization amount of a memory layer is reduced, an allowable range in current for writing can be increased by reducing a threshold value of current for writing. However, as described above, this impairs thermal stability of the memory layer (index Δ). A thermal stability index Δ may preferably have a certain value or higher when forming a memory.

According to an embodiment, a memory layer has an improved coercive force and can have improved thermal stability without increasing an amount of current for writing, and a stable memory can be formed by specifying a magnetostriction constant of a ferromagnetic layer forming the memory layer.

According to an embodiment, an effective ferromagnetic layer forming the memory layer has a magnetostriction constant of $1 \times 10^{-5}$ or more.

A coercive force that is improved by controlling a magnetostriction constant is described below.

Origins of magnetic anisotropy of a tiny magnetic element having an elliptical shape are classified into magnetocrystalline anisotropy or induced magnetic anisotropy of a magnetic material, shape anisotropy of the element, and uniaxial anisotropy by magnetostriction, for example.

A memory element that is configured to record information by changing a magnetization direction by spin injection preferably has uniaxial anisotropy having two stable states, since a change in a resistance value is maximum when a magnetization direction of a memory layer is parallel or antiparallel to a magnetization direction of a magnetization pinned layer.

Here, magnitudes of the above various anisotropies are estimated in a tiny memory element having a size of several hundred nm or smaller.

First, magnetocrystalline anisotropy may not be an origin of uniaxial anisotropy, because a magnetic film is generally deposited by sputtering, and the magnetic film prepared by sputtering is generally polycrystalline and randomly oriented in an in-plane direction.

Second, induced magnetic anisotropy added by a magnetic field applied when a memory layer is deposited by sputtering or thermally treated may be an origin of uniaxial anisotropy. However, a coercive force generated by the induced magnetic anisotropy is only about several ten [Oe], and the induced magnetic anisotropy alone may not secure a thermal stability index Δ that may be necessary for thermal stability.

Third, shape magnetic anisotropy resulting from an element shape such as an elliptical shape is increased with reducing size of a memory element. Thus, the shape anisotropy has an excellent property as a memory, and can generate a coercive force of 100 [Oe] or more when an element size is about 100 nm or smaller.

A total coercive force by uniaxial anisotropy originating from induced anisotropy and shape anisotropy may be a little less than about 130 [Oe] by reducing an element in size. However, since a memory layer has a decreased volume when reducing the element in size, a thermal stability index Δ of 60 or more which may be necessary for thermal stability may not be obtained.

By contrast, when a magnetostriction constant is $1 \times 10^{-5}$ or more, a stress applied in a chip undergoing a common semiconductor MOS formation process is several hundred MPa or more. Thus, a coercive force of about 100 [Oe] or more can be stably achieved by uniaxial anisotropy originating from magnetostriction. Specifically, a coercive force by uniaxial anisotropy originating from magnetostriction is equal to or higher than a coercive force by uniaxial anisotropy originating from the above-described induced magnetic anisotropy or shape anisotropy, and a coercive force by these anisotropies reaches 150 [Oe] or more. Thus, it is possible to obtain a thermal stability index ≠ that may be necessary for thermal stability.

When a magnetostriction constant is less than $1 \times 10^{-5}$, a sufficient coercive force may not be achieved and a coercive force may easily be changed if a stress is changed with an environment, so that a thermal stability index Δ may result in less than 60.

In an embodiment, information retaining properties of a memory layer of a memory element utilizing spin injection may be achieved if the memory layer has a magnetostriction constant of $1 \times 10^{-5}$ or more, as described above.

In a configuration of the related art, an amount of inversion current and information retaining ability of a memory layer tend to be increased. However, the above embodiment of the present invention can improve information retaining ability of a memory layer without increasing an amount of inversion current, and can achieve a highly desirable result.

As examples of the ferromagnetic material having a large magnetostriction constant, a common CoFe alloy, NiFe alloy, or CoNiFe alloy having Co, Fe, or Ni is used as a main component. Such a ferromagnetic alloy may also contain one or more additional elements including light elements such as B, C, and N; transition metals such as Ti, V, Cr, Zr, Nb, Mo, Hf, Ta, and W; rare earth elements such as Gd; or noble metal elements such as Pt and Pd. Desirable properties may be achieved when the ferromagnetic material contains such an additional element.

However, when the CoFe alloy contains Co and Fe at 60 atom % or less in total, an amount of saturation magnetization and a coercive force of a ferromagnetic layer are not satisfactory, for example.

When the CoFe alloy has a Co:Fe ratio of 90:10 to 40:60, the alloy generally exhibits good soft magnetic properties in which magnetic anisotropic dispersion is appropriately suppressed.

Accordingly, contents of Co and Fe can be selected in order to provide excellent properties for a ferromagnetic component with an embodiment, as described above.

An amorphous material or a Heusler material such as CoMnSi, CoMnAl, or CoCrFeAl may also be used for a ferromagnetic layer of a memory layer. Such a material can secure a large magnetostriction constant.

In a configuration according to an embodiment of the present invention, a ferromagnetic layer forming a memory layer preferably has a coercive force as large as possible. Specifically, the ferromagnetic layer preferably has a coercive force of 150 [Oe] or more.

In a configuration according to an embodiment of the present invention, a ferromagnetic layer has a coercive force of 150 [Oe] or more, so that sufficient thermal stability of a memory layer can be obtained and an increase in an amount of inversion current can be suppressed.

Further, in an embodiment of the present invention, a magnetic tunnel junction (MTJ) element is formed using a tunnel insulating layer formed of an insulator as a non-magnetic intermediate layer between a memory layer and a magnetization pinned layer, allowing to include a saturation current value of a selective transistor.

A magnetic tunnel junction (MTJ) element is formed using a tunnel insulating layer, so that a magnetoresistance change rate (MR rate) can be increased and a read signal strength can be increased as compared with a case where a giant magnetoresistance (GMR) element is formed using a non-magnetic conductive layer.

Magnesium oxide (MgO) is particularly used as a material for a tunnel insulating layer, so that a magnetoresistance change rate (MR rate) can be increased as compared with a case of using aluminum oxide that has been generally used.

Spin injection efficiency generally depends on an MR rate. As the MR rate is higher, the spin injection efficiency is further improved, thereby further reducing a density of magnetization inversion current.

Accordingly, magnesium oxide is used as a material for a tunnel insulating layer as an intermediate layer and a memory layer having the above-described configuration is simultaneously used, so that an amount of writing threshold current by spin injection can be reduced, and hence information can be written (recorded) using a small amount of current. In addition, a writing signal strength can be increased.

Thus, an MR rate (TMR rate) is obtained, so that an amount of writing threshold current by spin injection can be reduced, and hence information can be written (recorded) using only a small amount of current. In addition, a writing signal strength can be increased.

When a tunnel insulating layer is formed of a magnesium oxide (MgO) film, it is more preferable that the MgO film be crystallized and maintain crystalline orientation in a 001 direction.

In an embodiment of the present invention, an intermediate layer between a memory layer and a magnetization pinned layer may not be formed of magnesium oxide (tunnel insulating layer), but may be formed with various insulators, dielectrics, or semiconductors such as aluminum oxide, aluminum nitride, $SiO_2$, $Bi_2O_3$, $MgF_2$, CaF, $SrTiO_2$, $AlLaO_3$, and Al—N—O.

Further, when using magnesium oxide for an intermediate layer, an annealing temperature is expected to be as high as 300° C. or more, and preferably 340° C. to 360° C. to achieve excellent magnetoresistance properties (MR properties). Such an annealing temperature is higher than an annealing temperature (250° C. to 280° C.) in the case of aluminum oxide that has been used for an intermediate layer in the related art.

Such an annealing temperature may be necessary for forming an appropriate internal structure or crystalline structure of a tunnel insulating layer of magnesium oxide, or the like.

Consequently, excellent MR properties can be achieved using a heat-resistant ferromagnetic material that is resistant to annealing at such a high temperature for a ferromagnetic layer of a memory element.

An area resistance value of a tunnel insulating layer is preferably controlled to be about several ten $\Omega\mu m^2$ or less to achieve a current density that may be necessary to invert a magnetization direction of a memory layer by spin injection.

In a tunnel insulating layer formed of an MgO film, the MgO film is preferably set to have a film thickness of 1.5 nm or less to achieve an area resistance value within the above-described range.

In addition, a memory element is preferably reduced in size, so that a magnetization direction of a memory layer can be easily inverted using only a small amount of current.

Accordingly, the memory element preferably has an area of 0.04 $\mu m^2$ or less.

A memory layer having the above-described configuration conditions may directly be stacked with another ferromagnetic layer having a different material or composition range. A ferromagnetic layer may also be stacked with a soft magnetic layer or with a plurality of ferromagnetic layers through a soft magnetic layer or non-magnetic layer. An embodiment of the present invention mat also provide an effect when layers are stacked in this manner.

Specifically, when a plurality of ferromagnetic layers are stacked through a non-magnetic layer, strength in an interaction between the ferromagnetic layers may be controlled. Accordingly, if a memory element has a submicron size or smaller, an amount of magnetization inversion current can be suppressed. As examples of the non-magnetic layer material in this case, Ru, Os, Re, Ir, Au, Ag, Cu, Al, Bi, Si, B, C, Cr, Ta, Pd, Pt, Zr, Hf, W, Mo, Nb, or an alloy thereof may be used.

A magnetization pinned layer preferably has unidirectional anisotropy, whereas a memory layer preferably has uniaxial anisotropy.

The magnetization pinned layer and the memory layer preferably have a film thickness of 1 nm to 30 nm, respectively.

Other configurations of a memory element may be the same as known configurations of a memory element in which information is recorded by spin injection.

A magnetization pinned layer is configured to have a pinned magnetization direction using only a ferromagnetic layer or an antiferromagnetic bond between an antiferromagnetic layer and a ferromagnetic layer.

The magnetization pinned layer is configured to be formed of a single ferromagnetic layer, or has a stacked ferrimagnetic structure in which a plurality of ferromagnetic layers are stacked through a non-magnetic layer.

When the magnetization pinned layer has a stacked ferrimagnetic structure, the magnetization pinned layer can have decreased sensitivity to an external magnetic field. Thus, unnecessary magnetization fluctuation in the magnetization pinned layer by the external magnetic field can be suppressed to stably operate a memory element. Further, a film thickness of each ferromagnetic layer can be controlled, and magnetic field leakage from the magnetization pinned layer can be suppressed.

As examples of the material for the ferromagnetic layer forming the magnetization pinned layer having a stacked ferrimagnetic structure, Co, CoFe, CoFeB, or the like may be used. As examples of the material for the non-magnetic layer, Ru, Re, Ir, Os, or the like may be used.

Materials for the antiferromagnetic layer include magnetic materials such as an FeMn alloy, a PtMn alloy, a PtCrMn alloy, an NiMn alloy, an IrMn alloy, NiO, and $Fe_2O_3$.

A non-magnetic element such as Ag, Cu, Au, Al, Si, Bi, Ta, B, C, O, N, Pd, Pt, Zr, Hf, Ir, W, Mo, or Nb can be added to the magnetic material to control magnetic properties or various other properties such as a crystal structure, crystallinity, and material stability.

In a film configuration of a memory element, a memory layer may be placed either on or under a magnetization pinned layer.

Information recorded in a memory layer of a memory element may be read from a magnetic layer provided as a reference to information for the memory layer of the memory element through a thin insulating film by causing ferroelectric tunnel current to flow through the insulating film or making magnetoresistance.

Embodiments are described as follows.

Figure 4:
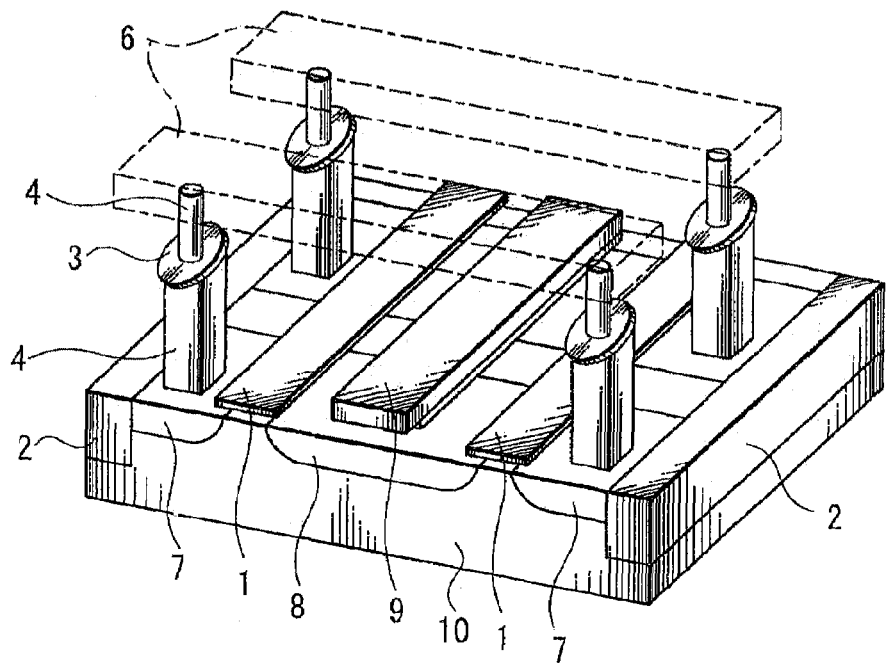
FIG. 4 is a schematic configuration diagram (perspective view) of a memory according to an embodiment.

FIG. 4 shows a schematic configuration diagram (perspective view) of a memory according to an embodiment.

The memory has a memory element placed near an intersection of two types of address wires (word lines and bit lines, for example) perpendicular to each other.

Specifically, a drain region 8, source regions 7, and gate electrodes 1 that are used as selective transistors for selecting each memory cell are respectively formed in an area isolated by an element isolation layer 2 of a semiconductor substrate 10 such as a silicon substrate. Of these, the gate electrodes 1 function as one type of address wirings (word lines, for example) extending in a longitudinal direction in the figure.

The drain region 8 is formed both on the left and right selective transistors in the figure, and a wiring 9 is connected to the drain region 8.

Memory elements 3 are placed between the source regions 7 and the other type of address wirings (bit lines, for example) 6 that are placed above the source regions 7 and extend in a transverse direction in the figure. The memory elements 3 have a memory layer formed of a ferromagnetic layer in which a magnetization direction is inverted by spin injection.

The memory elements 3 are placed near an intersection of the two types of address wirings 1 and 6.

The memory elements 3 are connected to the bit lines 6 and the source regions 7 respectively through upper or lower contact layers 4.

Thus, a magnetization direction of the memory layer can be inverted by spin injection by causing current to flow into the memory elements 3 in a vertical direction through the two types of address wirings 1 and 6.

Figure 5:
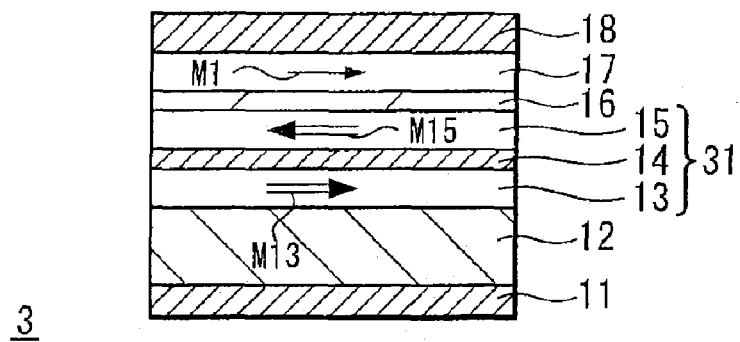
FIG. 5 is a sectional view of a memory element of FIG. 4.

FIG. 5 shows a sectional view of the memory element 3 of the memory according to the present embodiment.

As shown in FIG. 5, the memory element 3 has a magnetization pinned layer 31 provided under a memory layer 17 in which a direction of magnetization M1 is inverted by spin injection. An antiferromagnetic layer 12 is provided under the magnetization pinned layer 31, and a magnetization direction of the magnetization pinned layer 31 is pinned by the antiferromagnetic layer 12.

An insulating layer 16 is provided as a tunnel barrier layer (tunnel insulating layer) between the memory layer 17 and the magnetization pinned layer 31, and an MTJ element is formed of the memory layer 17 and the magnetization pinned layer 31.

A ground layer 11 is formed under the antiferromagnetic layer 12, and a cap layer 18 is formed on the memory layer 17.

The magnetization pinned layer 31 has a stacked ferrimagnetic structure.

Specifically, the magnetization pinned layer 31 has two ferromagnetic layers 13 and 15 that are stacked through a non-magnetic layer 14 and antiferromagnetically bonded.

Since the ferromagnetic layers 13 and 15 of the magnetization pinned layer 31 form a stacked ferromagnetic structure, magnetization M13 of the ferromagnetic layer 13 is right-directed and magnetization M15 of the ferromagnetic layer 15 is left-directed, and thus, the magnetizations are oppositely directed. Thus, magnetic fluxes leaked from the ferromagnetic layers 13 and 15 of the magnetization pinned layer 31 cancel each other.

A material for the ferromagnetic layers 13 and 15 of the magnetization pinned layer 31 is not specifically limited. An alloy material formed of one or more of iron, nickel, and cobalt may be used as such a material. The material may further contain a transition metal element such as Nb, Zr, Gd, Ta, Ti, Mo, Mn, or Cu, or a light element such as Si, B, or C. Further, the ferromagnetic layers 13 and 15 may be formed by directly stacking a plurality of films with materials differing from each other (not through a non-magnetic layer), for example, by forming stacked films of CoFe/NiFe/CoFe.

As examples of the material for the non-magnetic layer 14 forming a stacked ferrimagnetic structure of the magnetization pinned layer 31, ruthenium, copper, chromium, gold, silver, or the like may be used.

A film thickness of the non-magnetic layer 14 varies with a material used. However, the thickness preferably ranges from about 0.5 nm to 2.5 nm.

In the present embodiment, the memory layer 17 of the memory element 3 is specifically formed of a ferromagnetic layer having a magnetostriction constant of $1 \times 10^{-5}$ or more.

The above-described various materials are suitable for increasing a magnetostriction constant and may be used for the ferromagnetic layer forming the memory layer.

Further, in the present embodiment, when an insulating layer 16 used as an intermediate layer is a magnesium oxide layer, a magnetoresistance change rate (MR rate) can be increased.

When An MR rate is increased in this manner, a current density that may be necessary to invert a direction of magnetization M1 of the memory layer 17 can be reduced by increasing spin injection efficiency.

The memory element 3 according to the present embodiment can be fabricated by continuously forming the elements from the ground layer 11 to the cap layer 18 in a vacuum apparatus and then forming a pattern of the memory element 3 by processing such as etching.

In the above-described present embodiment, the memory layer 17 of the memory element 3 is formed of a ferromagnetic layer having a magnetostriction constant of $1 \times 10^{-5}$ or more. Sufficient thermal stability of the memory layer 17 can thus be obtained without increasing an amount of current for writing that may be necessary to invert a direction of magnetization M1 of the memory layer 17.

When thermal stability of the memory layer 17 is improved, an operation region may be increased in which information is recorded by causing current to flow into the memory element 3, and to secure a sufficient operation allowance to stably operate the memory element 3.

Since an amount of current for writing is not increased even if thermal stability is obtained for the memory layer 17 of the memory element 3, a large amount of current does not have to be applied. Thus, dielectric of the insulating layer 16 as an intermediate layer may not be damaged.

Accordingly, a highly reliable memory that is stably operated can be achieved.

Further, sufficient thermal stability can be obtained even if an amount of current for writing is reduced, and thus an amount of current for writing can be decreased to reduce power consumption when performing writing in the memory element 3.

Therefore, total power consumption can be reduced in a memory having a memory cell formed of the memory element 3 according to the present embodiment.

Accordingly, a highly reliable memory that has excellent information retaining properties and is stably operated may be achieved, and power consumption may be reduced in a memory having the memory element 3.

A memory having the memory element 3 shown in FIG. 5 and having a configuration shown in FIG. 4 is advantageous in that a common semiconductor MOS formation process can be used for fabrication of the memory. For example, the memory layer 17 can be resistant to annealing at 340° C. to 360° C. without deterioration of magnetic properties.

Thus, a memory having the memory element 3 according to the present embodiment can be used as a general memory.

Here, properties of a memory element configured according to an embodiment of the present invention were examined, in which a material such as a ferromagnetic material forming a memory layer, film thickness, and the like were specifically selected for each layer.

Figure 2:
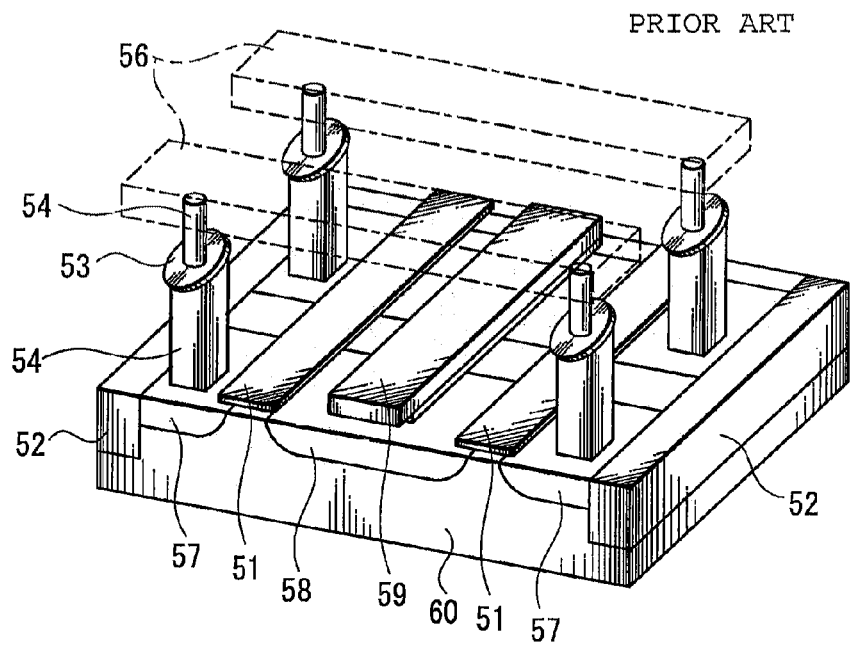
FIG. 2 is a schematic configuration diagram (perspective view) of a memory utilizing magnetization inversion by spin injection.
Figure 3:
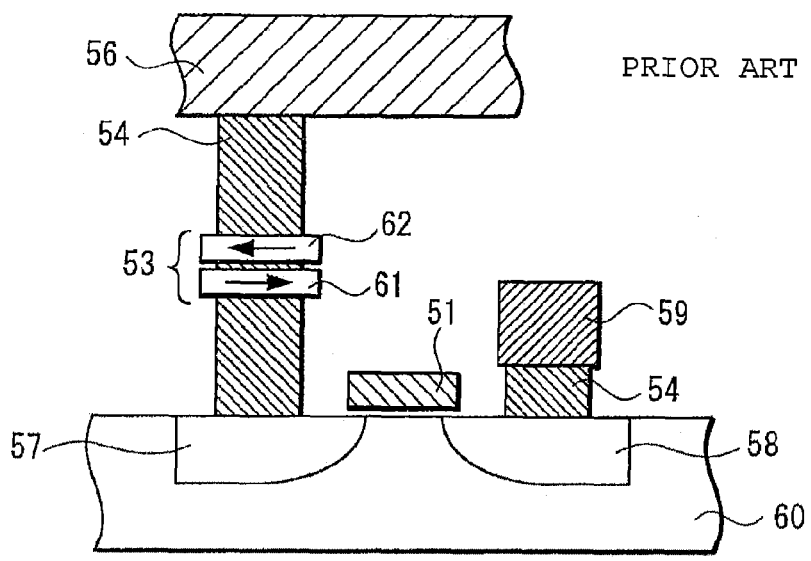
FIG. 3 is a sectional view of the memory of FIG. 2.

An actual memory has a switching semiconductor circuit or the like other than a memory element, as shown in FIGS. 2 and 4. However, description of a production step of a selective transistor or lower layer wiring is omitted.

Figure 6:
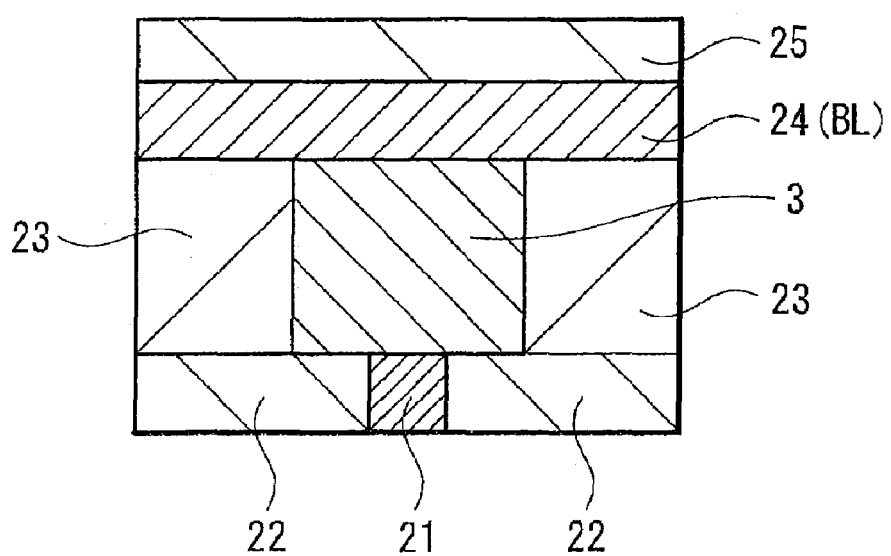
FIG. 6 is a schematic sectional view of a sample of a memory element prepared for property measurement.

In FIG. 4, upper and lower contact layers 4 are connected to a memory element 3. However, in this case, a bit line 24 (BL) is directly connected onto a memory element 3, as shown in a sectional view of FIG. 6.

A memory element 3 having a configuration shown in FIG. 5 was formed on an insulating layer 22 in which a contact layer 21 connected to a lower layer wiring was formed.

Specifically, each layer in the memory element 3 having a configuration as shown in FIG. 5 was formed by selecting a material and film thickness of each layer in the following manner. A ground film 11 was a Ta film having a film thickness of 3 nm. An antiferromagnetic layer 12 was a PtMn film having a film thickness of 20 nm. A ferromagnetic layer 13 forming a magnetization pinned layer 31 was a CoFe film having a film thickness of 2 nm. A ferromagnetic layer 15 was a CoFeB film having a film thickness of 2.5 nm. A nonmagnetic layer 14 forming the magnetization pinned layer 31 having a stacked ferrimagnetic structure was an Ru film having a film thickness of 0.8 nm. An insulating layer (barrier layer) 16 as a tunnel insulating layer was a magnesium oxide film having a film thickness of 0.9 nm. A memory layer 17 was formed of a ferromagnetic material. A cap layer 18 was a Ta film having a film thickness of 5 nm.

The ferromagnetic layer of the memory layer 17 in the above-described film configuration was prepared by changing a material for the ferromagnetic layer as shown in Table 1 for Examples and Comparative Examples. The PtMn film had a composition of Pt 50:Mn 50 (atom %), and the CoFe film had a composition of Co 90:Fe 10 (atom %).

Each layer other than the insulating layer 16 formed of a magnesium oxide film was deposited by DC magnetron sputtering.

The insulating layer 16 formed of a magnesium oxide (MgO) film was deposited by RF magnetron sputtering.

After deposition of each layer of the memory element 3, the PtMn film of the antiferromagnetic layer 12 was thermally treated for regularization at 10 K Oe at 360° C. for two hours in a magnetic thermal treatment furnace.

Thereafter, a mask of a pattern of the memory element 3 was formed by an electron beam lithography apparatus, and the stacked films were selectively etched by Ar plasma to form the memory element 3.

At this point, the stacked films other than the part of the memory element 3 were etched to a depth of an insulating layer 22 lower than the ground layer 11 of 5 nm.

Since a sufficient amount of current is preferably caused to flow into a memory element in order to generate spin torque that may be necessary for magnetization inversion, it is preferable to suppress a resistance value of a tunnel insulating layer.

Thus, the memory element 3 was configured to have an elliptical pattern (minor axis: 0.09 μm×major axis: 0.18 μm) and have an area resistance value of 20 $\Omega/m^2$. However, only Sample No. 3 had a minor axis of 0.06 μm and a major axis of 0.09 μm.

Next, in order to insulate a periphery of the memory element 3, a silicon nitride film and an insulating film 23 of $SiO_2$, $Al_2O_3$, or the like were deposited on a whole surface of the memory element 3 by CVD (Chemical Vapor Deposition) or PVD (Physical Vapor Deposition).

Thereafter, the surface was polished and flattened by CMP (Chemical Mechanical Polishing) to expose the cap layer 18, so that a contact area was formed.

Subsequently, a bit line 24, a peripheral circuit wiring (not shown), and a bonding pad region (not shown) were formed by a standard wiring formation technique. Further, a plasma silicon nitride film 25 was deposited on an overall surface of the bit line 24 and the bonding pad region was opened to complete LSI (Large Scale Integration) wafer process steps.

A sample of the memory element 3 was prepared in this manner.

Each sample of the memory element 3 was prepared by the above production method by changing a material of the ferromagnetic layer of the memory layer 17 as shown in Table 1. A composition of the memory layer is shown in Table 1 as a condition for forming a sample.

Properties of each sample of the memory element 3 prepared were evaluated in the following manner.

Prior to the measurement, each sample was configured such that a magnetic field may be provided for the memory element 3 from the outside in order to control a value in a positive direction of inversion current to be symmetrical with a value in a negative direction of inversion current. Voltage applied to the memory element 3 was set to be 1 V or less which may not damage the insulating layer 16.

(Measurement of Coercive Force)

A coercive force of the memory element was measured.

First, a resistance value of the memory element was measured while applying a continuously changing external magnetic field to the memory element. At this point, a temperature was controlled to room temperature (25° C.), and bias voltage applied to a terminal of the word line and a terminal of the bit line was controlled to 10 mV.

When an external magnetic field is applied in a direction opposite to a magnetization direction of the memory layer and the external magnetic field exceeds a coercive force of the memory layer, the magnetization direction of the memory layer is inverted. Since a resistance value of the memory element is changed by inversion of the magnetization direction, a magnitude of the external magnetic field when the resistance value is changed may be equal to a coercive force of the memory element. Based on this, a coercive force of the memory element was determined.

(Measurement of Inversion Current Value and Thermal Stability)

An inversion current value was measured to evaluate writing properties of a memory element according to an embodiment.

Current having a pulse width of 100 ns to 1 ms was caused to flow into a memory element to measure a resistance value of the memory element thereafter. Further, an amount of current caused to flow into the memory element was changed to determine a current value in which magnetization of a memory layer was inverted. A value obtained by extrapolating pulse width dependence into a pulse width of 1 ns was defined as an inversion current value.

A pulse width dependence inclination of an inversion current value corresponds to a thermal stability index ($\Delta$) described above of a memory element. As a change in (or inclination of) an inversion current value based on a pulse width is smaller, a memory element is more resistant to thermal disturbance. As described above, in order to use a memory element for a memory, a index thermal stability index $\Delta$ of 60 or more is preferable.

Allowing to include a variation among memory elements, about 20 memory elements having the same configuration were prepared and the above measurement was conducted to determine an average inversion current value and an average thermal stability index ($\Delta$).

Measurement results for each sample are shown in Table 1 with magnetostriction constants determined from a material and a composition of the memory layer.

An embodiment may employ not only a film configuration of the memory element 3 shown in each of the above-described embodiments but also various other film configurations.

In each of the above-described embodiments, the magnetization pinned layer 31 has a stacked ferrimagnetic structure formed of the two ferromagnetic layers 13 and 15 and the non-magnetic layer 14. However, the magnetization pinned layer may be formed of a single ferromagnetic layer, for example.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A memory element comprising:
   a memory layer that retains information based on a magnetization state of a magnetic material,
   a magnetization pinned layer; and
   an intermediate layer, wherein:

TABLE 1

| Sample No. | Composition of memory layer (atom %) | Size of memory element (elliptical shape, μm) | Magnetostriction constant ($\times 10^{-5}$) | Coercive force of memory element (Oe) | Thermal stability index $\Delta$ | Inversion current value (μA) | Remarks |
|---|---|---|---|---|---|---|---|
| 1 | Ni50Fe20 | 0.09 × 0.18 | 4 | 30 | 25 | 520 | Comparative Example |
| 2 | Co100 | 0.06 × 0.09 | −0.1 | 40 | 30 | 500 | Comparative Example |
| 3 | Co90Fe10 | 0.09 × 0.18 | 6 | 120 | 40 | 180 | Comparative Example |
| 4 | Co50Fe30B20 | 0.09 × 0.18 | 30 | 180 | 70 | 440 | Example |
| 5 | Co45Fe25Ta10B20 | 0.09 × 0.18 | 40 | 200 | 75 | 430 | Example |

As clear from the results in Table 1, when the memory element has a ®magnetostriction constant of $10 \times 10^{-6}$ or more, specifically, $1 \times 10^{-5}$ or more, a coercive force of 150 [Oe] or more can be achieved. When a magnetostriction constant is less than $1 \times 10^{-5}$, a coercive force is smaller than 150 [Oe]. Even in a sample No. 3 in which shape anisotropy is increased by reducing the element in size, a coercive force is only 120 [Oe].

That is, a magnetostriction constant of $1 \times 10^{-5}$ or more may be effective.

As clear from Table 1, a thermal stability index $\Delta$ is highly correlated with a coercive force, and a thermal stability index $\Delta$ is 60 or more when a coercive force of 150 [Oe] or more.

Sample No. 3 having a decreased volume secures a coercive force has a coercive force increased as compared with Sample Nos. 1 and 2. However, a thermal stability index $\Delta$ of Sample No. 3 is not increased so much and may not reach 60.

In this manner, an embodiment of the present invention can secure a thermal stability index $\Delta$ of 60 or more which may be necessary for an actual memory.

An inversion current value may not be changed so much and a small inversion current value may be maintained even when a magnetostriction constant is changed. Sample No. 3 having a decreased volume has an inversion current value smaller than that of another sample, because a ferromagnetic material of the memory layer has a decreased volume.

Accordingly, the present embodiments can both secure sufficient thermal stability and a decrease in an amount of inversion current which may have a trade-off relation.

the magnetization pinned layer is provided for the memory layer through the intermediate layer,
the intermediate layer comprises an insulator, wherein the insulator is comprised of MgO,
spin-polarized electrons are injected in a stacking direction to change a magnetization direction of the memory layer, so that information is recorded in the memory layer, and
a ferromagnetic layer forming the memory layer has a magnetostriction constant greater than $1 \times 10^{-5}$ and a coercive force greater than or equal to 150 Oe.

2. A memory element according to claim 1, wherein the ferromagnetic layer forming the memory layer has a magnetostriction constant greater than $6 \times 10^{-5}$.

3. A memory element according to claim 2, wherein the ferromagnetic layer forming the memory layer has a magnetostriction constant greater than about $30 \times 10^{-5}$.

4. A memory according to claim 1, wherein the ferromagnetic layer forming the memory layer has a magnetostriction constant greater than about $30 \times 10^{-5}$.

5. A memory comprising:
   a memory element having a memory layer that retains information based on a magnetization state of a magnetic material; and
   two types of wirings intersecting with each other, wherein:
      the memory element has a magnetization pinned layer that is provided for the memory layer through an intermediate layer, the intermediate layer comprises an insulator; wherein the insulator is comprised of MgO, spin-polarized electrons are injected in a stacking direction to change a magnetization direction of the memory layer, so that information is recorded in the memory layer; and a ferromagnetic layer forming the memory layer has a magnetostriction constant greater than $1 \times 10^{-5}$ and a coercive force greater than or equal to 150 Oe, the memory element is placed near an intersection of the two types of wirings and between the two types of wirings, and current in the stacking direction flows into the memory element through the two types of wirings.

6. A memory according to claim 5, wherein the ferromagnetic layer forming the memory layer has a magnetostriction constant greater than $6 \times 10^{-5}$.

* * * * *